United States Patent
Lee et al.

(10) Patent No.: US 11,304,044 B2
(45) Date of Patent: Apr. 12, 2022

(54) BLUETOOTH CONNECTION DEVICE AND METHOD BASED ON ESTIMATION OF RELATIVE ANGLE

(71) Applicant: ELECTRONICS AND TELECOMMUNICATIONS RESEARCH INSTITUTE, Daejeon (KR)

(72) Inventors: Jae-Ho Lee, Daejeon (KR); Do-Hyung Kim, Daejeon (KR); Jin-Kyeong Kim, Daejeon (KR); Cheol Ryu, Daejeon (KR); Hyung-Seok Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/993,990

(22) Filed: Aug. 14, 2020

(65) Prior Publication Data

US 2021/0058757 A1    Feb. 25, 2021

(30) Foreign Application Priority Data

Aug. 19, 2019   (KR) .................. 10-2019-0101215
Jul. 31, 2020   (KR) .................. 10-2020-0095873

(51) Int. Cl.
*H04W 4/80* (2018.01)
*H04W 84/18* (2009.01)
(Continued)

(52) U.S. Cl.
CPC ............ *H04W 4/80* (2018.02); *H03M 13/09* (2013.01); *H04W 8/005* (2013.01); *H04W 76/14* (2018.02); *H04W 84/18* (2013.01)

(58) Field of Classification Search
CPC combination set(s) only.
See application file for complete search history.

(56) References Cited

U.S. PATENT DOCUMENTS 9,002,401 B2   4/2015   Kang et al.
9,078,093 B2   7/2015   Kwak et al.
(Continued)

FOREIGN PATENT DOCUMENTS

KR   10-1436760       9/2014
KR   10-2015-0145116  12/2015
(Continued)

OTHER PUBLICATIONS

Martin Woolley, "Bluetooth Direction Finding A Technical Overview", Version: 1.0, Mar. 20, 2019.

*Primary Examiner* — Cindy Trandai
(74) *Attorney, Agent, or Firm* — Kile Park Reed & Houtteman PLLC

(57) ABSTRACT

Disclosed herein are a Bluetooth connection device and method based on estimation of a relative angle. The Bluetooth connection method based on estimation of a relative angle is performed by a Bluetooth connection device based on estimation of a relative angle, and includes estimating relative angles using relative angle estimation information included in packets received from one or more communication target devices that are scanned for a Bluetooth connection, determining a communication target device with which a communication link is to be established based on the estimated relative angles, and establishing a communication link through a Bluetooth connection to the determined communication target device, and reestablishing the communication link to any one of additional communication target devices, relative angles of which have been estimated, depending on a change in a relative angle to the communi- (Continued)

cation target device with which the communication link has been established.

18 Claims, 8 Drawing Sheets

(51) Int. Cl.
    *H03M 13/09*     (2006.01)
    *H04W 76/14*     (2018.01)
    *H04W 8/00*     (2009.01)

(56) References Cited

U.S. PATENT DOCUMENTS

| | | |
|---|---|---|
| 9,638,534 B2 | 5/2017 | Kim |
| 9,781,559 B2 | 10/2017 | Kim et al. |
| 10,489,515 B2 | 11/2019 | Choi et al. |
| 2006/0256959 A1 | 11/2006 | Hymes |
| 2008/0311957 A1* | 12/2008 | Jantunen ............... H04W 8/005 455/560 |
| 2016/0165397 A1* | 6/2016 | Yang ..................... G01S 13/765 455/456.5 |
| 2018/0017946 A1* | 1/2018 | Kyou ..................... G04R 20/26 |
| 2018/0063879 A1 | 3/2018 | Lee |
| 2018/0176776 A1* | 6/2018 | Knaappila ............. H04W 12/06 |
| 2019/0053124 A1* | 2/2019 | Bitra ..................... H04W 76/10 |
| 2020/0236494 A1* | 7/2020 | Ronan ................... H04W 76/10 |
| 2020/0379696 A1* | 12/2020 | Konji .................... G06F 3/1204 |
| 2020/0380937 A1* | 12/2020 | Yano ..................... G09G 5/38 |
| 2020/0383036 A1* | 12/2020 | Abe ...................... H04W 48/10 |

FOREIGN PATENT DOCUMENTS

| | | |
|---|---|---|
| KR | 10-1644608 | 8/2016 |
| KR | 10-1655820 | 9/2016 |
| KR | 10-1897118 | 9/2018 |
| KR | 10-2019-0093956 | 8/2019 |

\* cited by examiner

BLUETOOTH CONNECTION DEVICE AND METHOD BASED ON ESTIMATION OF RELATIVE ANGLE

CROSS REFERENCE TO RELATED APPLICATIONS

This application claims the benefit of Korean Patent Application Nos. 10-2019-0101215, filed Aug. 19, 2019 and 10-2020-0095873, filed Jul. 31, 2020, which are hereby incorporated by reference in their entireties into this application.

BACKGROUND OF THE INVENTION

1. Technical Field

The present invention relates generally to Bluetooth technology, and more particularly to technology that intuitively forms Bluetooth pairing using a technique for estimating the relative angle between devices.

2. Description of the Related Art

In order to configure a Bluetooth communication link, a user may go through a procedure for searching for Bluetooth devices near the user using a host device and personally selecting a device to which to connect, or may attempt to make a Bluetooth connection using recent pairing information.

In greater detail, when a user device initially configures a communication link to a Bluetooth device, a connection between the two devices is permitted depending on a pairing procedure. In the case of a smartphone, a user checks a list of Bluetooth devices found as a result of a search on a display, personally selects a device to which to connect, and attempts to establish a Bluetooth connection to the desired device.

In another example, when there is information about devices previously paired to a Bluetooth device, a link to the last connected device is automatically established.

These conventional schemes are problematic in that the step of mutually searching for Bluetooth devices is essentially included in a connection procedure and it takes a lot of time for a user to identify and select a communication target. In a place where there are multiple Bluetooth devices, establishing a connection between devices is even more inconvenient.

In particular, glasses-type devices, such as a Head-Mounted Display (HMD) or smart glasses, are inferior to smartphones which support a multi-touch scheme from the standpoint of a user input interface. In such glasses-type terminals, when many devices are found near the user as the result of a search, or when frequent connection and disconnection between devices is required, the user experiences inconvenience in identifying and selecting a connection target.

Meanwhile, in accordance with direction-finding technology included in the Bluetooth 5.1 standard, there is provided a function of calculating the difference between the phases of radio waves received by multiple antennas and estimating the relative angle to a transmitting device. In addition, as Bluetooth standards related to the present invention, there are technologies such as wake-up radio and easy pairing.

Meanwhile, Korean Patent Application Publication No. 10-2015-0145116 entitled "Apparatus and Method for Establishing Communication link to Communication Target Device" discloses a communication link establishment apparatus and method, wherein a subject terminal transmits identification information thereof and threshold value information required for setting a relative angle measurement target to neighboring terminals including a target terminal possessed by a target, and establishes a communication link to the target terminal based on information included in a response signal received from the corresponding target terminal responding to the transmitted information.

SUMMARY OF THE INVENTION

Accordingly, the present invention has been made keeping in mind the above problems occurring in the prior art, and an object of the present invention is to provide an intuitive wireless connection while minimizing an interface for a connection operation between devices supporting Bluetooth pairing.

Another object of the present invention is to enable a new connection to an additional device to be naturally established even if a connection between devices supporting Bluetooth pairing has been released.

A further object of the present invention is to make it easy to select and identify a device desired by a user from among devices supporting Bluetooth pairing and to provide a connection and transmit information to a device located in a specific direction.

Yet another object of the present invention is to improve user convenience and marketability and provide new services through a convenient wireless connection.

In accordance with an aspect of the present invention to accomplish the above objects, there is provided a Bluetooth connection method based on estimation of a relative angle, the Bluetooth connection method being performed by a Bluetooth connection device based on estimation of a relative angle, the Bluetooth connection method including estimating relative angles using relative angle estimation information included in packets received from one or more communication target devices that are scanned for a Bluetooth connection; determining a communication target device with which a communication link is to be established based on the estimated relative angles; and establishing a communication link through a Bluetooth connection to the determined communication target device, and reestablishing the communication link to any one of additional communication target devices, relative angles of which have been estimated, depending on a change in a relative angle to the communication target device with which the communication link has been established.

Estimating the relative angles may be configured to receive the packets from the one or more communication target devices set to an operation mode in a state in which a Bluetooth connection is not established.

Estimating the relative angles may be configured to calculate incidence angles at which radio waves corresponding to the packets are incident on antennas using the relative angle estimation information included in the packets, and to estimate the relative angles to the communication target devices that transmitted the packets using angles between the incidence angles and an angle defined by a preset forward direction.

Estimating the relative angles may be configured to, when an error is not found as a result of performing a partial Cyclic Redundancy Check (CRC) check on a payload of each packet, determine that the relative angle estimation information is included in the payload in which a de-whitening procedure is skipped.

Determining the communication target device may be configured to determine at least one communication target device, a relative angle of which is less than a preset first relative angle, among multiple communication target devices, relative angles of which have been estimated, to be the communication target device with which the communication link is to be established.

Determining the communication target device may be configured to determine a communication target device, a Received Signal Strength Indictor (RSSI) value of which is equal to or greater than a preset value, among communication target devices, the relative angles of which are less than the preset first relative angle, to be the communication target device with which the communication link is to be established.

Establishing the communication link may be configured to, when the relative angle to the communication target device with which the communication link has been established is changed to a preset second relative angle or more, reestablish the communication link to any one of the communication target devices, relative angles of which are less than the preset first relative angle.

Establishing the communication link may be configured to set at least one of the second relative angle for reestablishing the communication link and a time for reestablishing the communication link to meet characteristics of the communication target device with which the communication link has been established using additional information received from the communication target device.

Establishing the communication link may be configured to, when the relative angle to the communication target device with which the communication link has been established is changed to the preset second relative angle or more and when a state in which the relative angle falls within a range of a preset first relative angle of any one of multiple communication target devices, the relative angles of which have been estimated, is maintained for the time for reestablishing the communication link or longer, reestablish the communication link.

In accordance with another aspect of the present invention to accomplish the above objects, there is provided a Bluetooth connection device, including one or more processors; and an execution memory for storing at least one program that is executed by the one or more processors, wherein the at least one program is configured to estimate relative angles using relative angle estimation information included in packets received from one or more communication target devices that are scanned for a Bluetooth connection; determine a communication target device with which a communication link is to be established based on the estimated relative angles; and establish a communication link through a Bluetooth connection to the determined communication target device, and reestablish the communication link to any one of additional communication target devices, relative angles of which have been estimated, depending on a change in a relative angle to the communication target device with which the communication link has been established.

The at least one program may be configured to receive the packets from the one or more communication target devices set to an operation mode in a state in which a Bluetooth connection is not established.

The at least one program may be configured to calculate incidence angles at which radio waves corresponding to the packets are incident on antennas using the relative angle estimation information included in the packets, and to estimate the relative angles to the communication target devices that transmitted the packets using angles between the incidence angles and an angle defined by a preset forward direction.

The at least one program may be configured to, when an error is not found as a result of performing a partial Cyclic Redundancy Check (CRC) check on a payload of each packet, determine that the relative angle estimation information is included in the payload.

The at least one program may be configured to determine at least one communication target device, a relative angle of which is less than a preset first relative angle, among multiple communication target devices, relative angles of which have been estimated, to be the communication target device with which the communication link is to be established.

The at least one program may be configured to determine a communication target device, a Received Signal Strength Indictor (RSSI) value of which is equal to or greater than a preset value, among communication target devices, the relative angles of which are less than the preset first relative angle, to be the communication target device with which the communication link is to be established.

The at least one program may be configured to, when the relative angle to the communication target device with which the communication link has been established is changed to a preset second relative angle or more, reestablish the communication link to any one of the communication target devices, relative angles of which are less than the preset first relative angle.

The at least one program may be configured to set at least one of the second relative angle for reestablishing the communication link and a time for reestablishing the communication link to meet characteristics of the communication target device with which the communication link has been established using additional information received from the communication target device.

The at least one program may be configured to, when the relative angle to the communication target device with which the communication link has been established is changed to the preset second relative angle or more and when a state in which the relative angle falls within a range of a preset first relative angle of any one of multiple communication target devices, the relative angles of which have been estimated, is maintained for the time for reestablishing the communication link or longer, reestablish the communication link.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
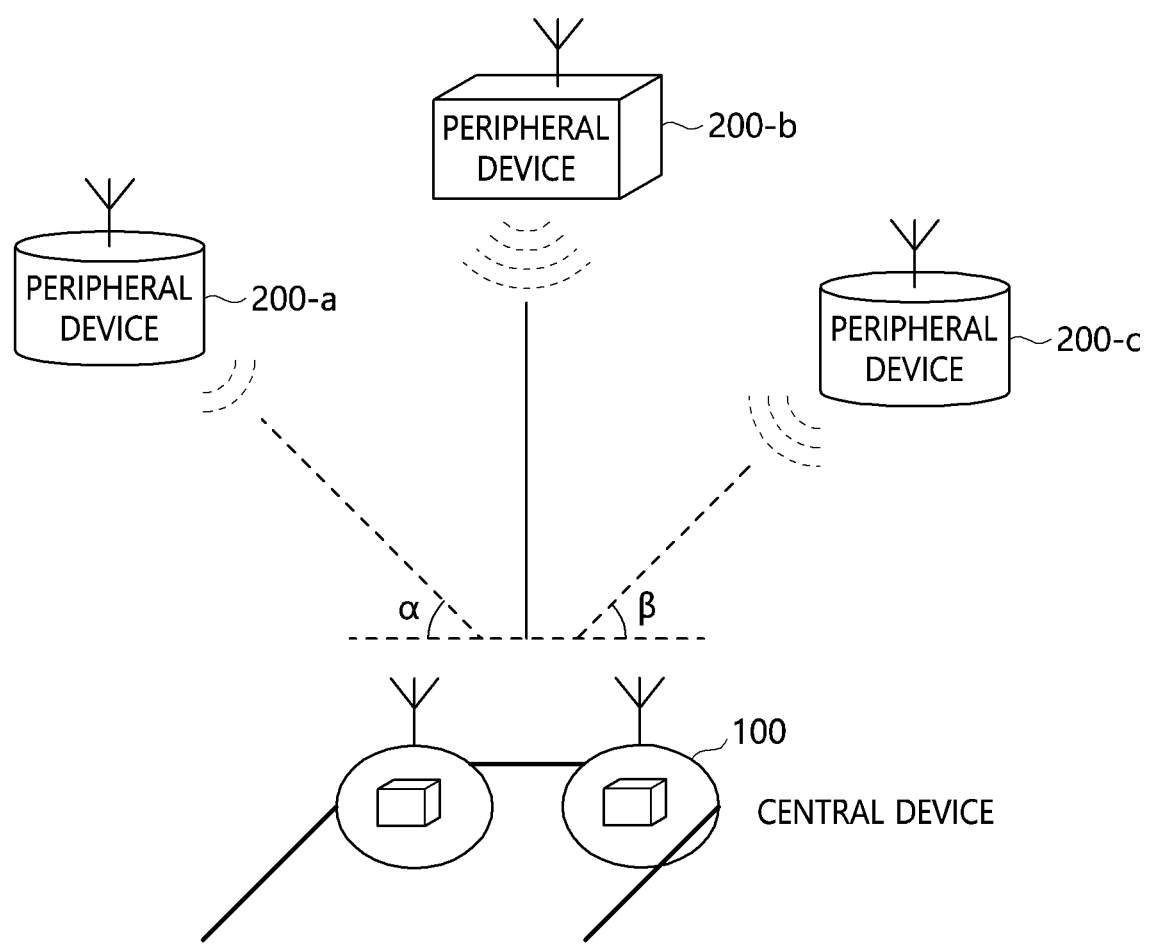
FIG. 1 is a diagram illustrating a wireless connection environment between communication targets according to an embodiment of the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

In the specification, when an element is referred to as "comprising" or "including" a component, it does not preclude another component, but may further include other components unless the context clearly indicates otherwise.

Hereinafter, preferred embodiments of the present invention will be described in detail with reference to the attached drawings.

FIG. 1 is a diagram illustrating a wireless connection environment between communication targets according to an embodiment of the present invention.

Referring to FIG. 1, the wireless connection environment between communication targets according to an embodiment of the present invention includes a communication subject device 100 and communication target devices 200.

The communication subject device 100 may be a Bluetooth connection device based on estimation of a relative angle according to an embodiment of the present invention, which requests connection to each communication target device 200, and may be a central device. The communication target devices 200-a, 200-b, and 200-c may be peripheral devices which provide services to the communication subject device 100 connected thereto.

The communication target devices 200 may provide services to various Bluetooth product groups which support Class, Smart Ready, and Smart specifications that are classified depending on whether the Bluetooth 4.1 standard (Bluetooth Low Energy: BLE) is supported.

A Bluetooth core specification 5.1 includes the direction-finding standard by which the angle of a radio wave transmitted from a single antenna can be calculated based on the difference between the phases of radio waves incident on a multi-array antenna.

Each communication target device 200 may transmit special-purpose data (e.g., Constant Tone Extension: CTE), which is a packet including relative angle estimation information, either periodically or randomly through an Advertising (ADV) signal or an Extended_Advertising (EXT_ADV) signal in an advertising mode, which is an operation mode in the state in which no Bluetooth connection to the communication subject device 100 has been established.

In this case, the communication subject device 100 may receive the packets, may estimate relative angles to the communication target devices 200 that transmitted the packets, may select any one communication target device, the relative angle of which is less than a preset relative angle, depending on the user's intention, and may intuitively establish a communication link to the selected communication target device 200 through a Bluetooth connection.

As illustrated in FIG. 1, the communication subject device 100 may define an angle defined by a preset forward direction as 0°, may calculate the incidence angles at which radio waves corresponding to the packets are incident on antennas, and may estimate relative angles to communication target devices that transmitted the packets based on angles between the incidence angles and an angle of 0° defined by the preset forward direction.

Here, it can be seen that the incidence angle of the communication target device 200-a may be α, the incidence angle of the communication target device 200-b is 0, and the incidence angle of the communication target device 200-c is β.

Further, it can also be seen that the relative angle between the communication subject device 100 and the communication target device 200-a is 90-α, the relative angle between the communication subject device 100 and the communication target device 200-b is 0, and the relative angle between the communication subject device 100 and the communication target device 200-c is 90-β.

Here, as the relative angle is closer to '0', the communication subject device 100 may determine that the corresponding communication target device is the communication target device 200 located in the forward direction, and may determine that the communication target device 200 having a relative angle less than the preset relative angle is the communication target device 200 with which a communication link is to be established (connected).

The communication subject device 100 may establish a communication link by displaying communication target devices 200, with which communication links can be established, to the user on a user interface via a display and by allowing the user to select any one communication target device 200, or by automatically making a Bluetooth connection to the communication target device 200 having the smallest relative angle.

Here, the communication subject device 100 may provide various interfaces for locating the communication target device 200 in a preset forward direction. When the communication subject device 100 is a smartphone, a communication link to the communication target device 200 may be established through an operation of pointing at the communication target device 200. When the communication subject device 100 is a glasses-type terminal device, a communication link to the communication target device 200 may be established through an operation of gazing at the communication target device 200.

Further, when the forward direction is changed and then the relative angle to the communication target device with which the communication link has been established is changed to a preset relative angle or more, the communication subject device 100 may reestablish the communication link to any one of the communication target devices 200 having relative angles less than the preset relative angle.

For example, in the state in which a communication link between the communication subject device 100 and the communication target device 200-b is established, when the forward direction is changed such that the communication subject device 100 faces the communication target device 200-a, the relative angle to the communication target device 200-a becomes the smallest relative angle, and thus the communication subject device 100 may reestablish the communication link to the communication target device 200-a.

That is, the Bluetooth connection device (i.e., the communication subject device) 100, based on estimation of a relative angle according to the embodiment of the present invention, may provide an intuitive user experience by establishing communication links to Internet-of-Things (IoT) devices located at a visible distance based on a very natural user interface through the operation of pointing at or gazing at an object.

Figure 2:
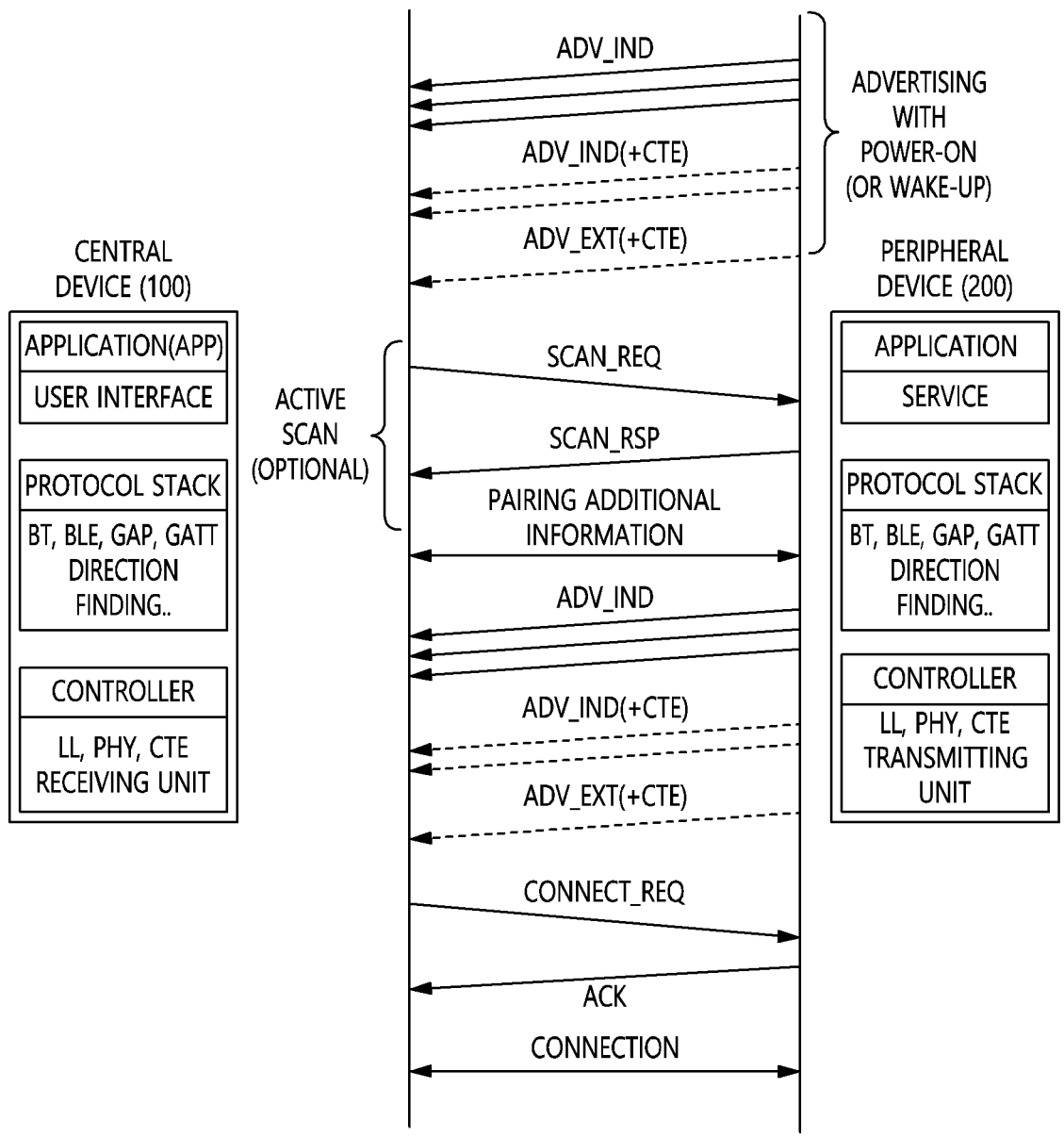
FIG. 2 is a sequence diagram illustrating a Bluetooth connection process based on estimation of a relative angle according to an embodiment of the present invention.

FIG. 2 is a sequence diagram illustrating a Bluetooth connection process based on estimation of a relative angle according to an embodiment of the present invention.

Referring to FIG. 2, it can be seen that a communication subject device (central device) 100 and a communication target device (peripheral device) 200 perform a Bluetooth connection process based on estimation of a relative angle using direction-finding technology in a Bluetooth core specification 5.1.

First, the communication target device 200 may broadcast a packet including relative angle estimation information CTE either at a regular period or at a random period through an advertising channel at the moment at which the communication target device 200 is booted.

That is, the relative angle estimation information may be broadcasted in the state in which a connection between devices is not established (i.e., connectionless state), and the packet including the relative angle estimation information may be received depending on the scan mode (i.e., passive scanning or active scanning) of the communication subject device 100.

Here, when the communication target device 200 supports the direction-finding standard, data CTE corresponding to the relative angle estimation information may be included in an extended advertising indication (ADV_EXT_IND) packet (i.e., an extended packet), and then the ADV_EXT_IND packet may be broadcasted.

When the communication target device 200 does not support the direction-finding standard or supports only old version Bluetooth standards, a partial Cyclic Redundancy Check (CRC) code and the relative angle estimation information CTE may be included in the payload of an advertising packet ADV_IND, and the advertising packet ADV_IND may be transmitted without performing a data whitening procedure.

In this case, the communication subject device 100 may identify a phase difference and estimate a relative angle while skipping a de-whitening procedure and an entire CRC check procedure only when the received packet is CTE transmitted without a data whitening procedure.

That is, the communication subject device 100 may perform a check procedure on the partial CRC code included in the payload of the received advertising packet ADV_IND for which a de-whitening procedure is skipped. When an error is not found as a result of the partial CRC check and the received packet is a packet including the relative angle estimation information, the communication subject device 100 may identify a phase difference from the communication target device 200 and then estimate the relative angle to the communication target device 200 based on the relative angle estimation information CTE.

Here, as an optional function, when the user explicitly issues a scan start command through an input device after the relative angle to the communication target device 200 has been estimated, the communication subject device 100 may scan surrounding communication target devices 200 while hopping between advertising channels.

In this case, as an optional function, the communication target device 200 may continuously broadcast a packet including CTE as if normal advertising packets were broadcasted.

Here, as a result of the estimation of the relative angle, the communication subject device 100 may request additional information required for the determination of a communication target through a scan request SCAN_REQ from the communication target device 200 with which a communication link is to be established.

The communication target device 200 may transmit a scan response SCAN_RSP, which is a response to the scan request SCAN_REQ, and may transmit/receive the additional information required for the determination of the communication target through the scan response SCAN_RSP.

For example, the additional information required for the determination of a communication target may include CTE and CTE-related communication parameters (e.g., CTE information, a CTE transmission period, the number of CTE transmissions, optimal transmission power etc.) that can be used to help calculate relative angle more accurately.

Also, in consideration of power consumption for relative angle estimation, the communication target device 200 may be any of fixed IoT devices (e.g., TV, a beam projector, etc.) mainly supplied with regular power. In the case of mobile IoT devices (e.g., a notebook, a speaker, etc.) which cannot be supplied with regular power, power consumption can be reduced by optimizing the transmission period and the number of transmissions according to the scheduling policy.

Here, the communication target device 200 may again broadcast an advertising packet even after the additional information has been provided. When the communication subject device 100 requests a Bluetooth connection for the usage of service from the communication target device 200 that provided the additional information, a communication link may be established (i.e., connection establishment), and then the communication subject device 100 may be provided with the corresponding service from the communication target device 200.

Figure 3:
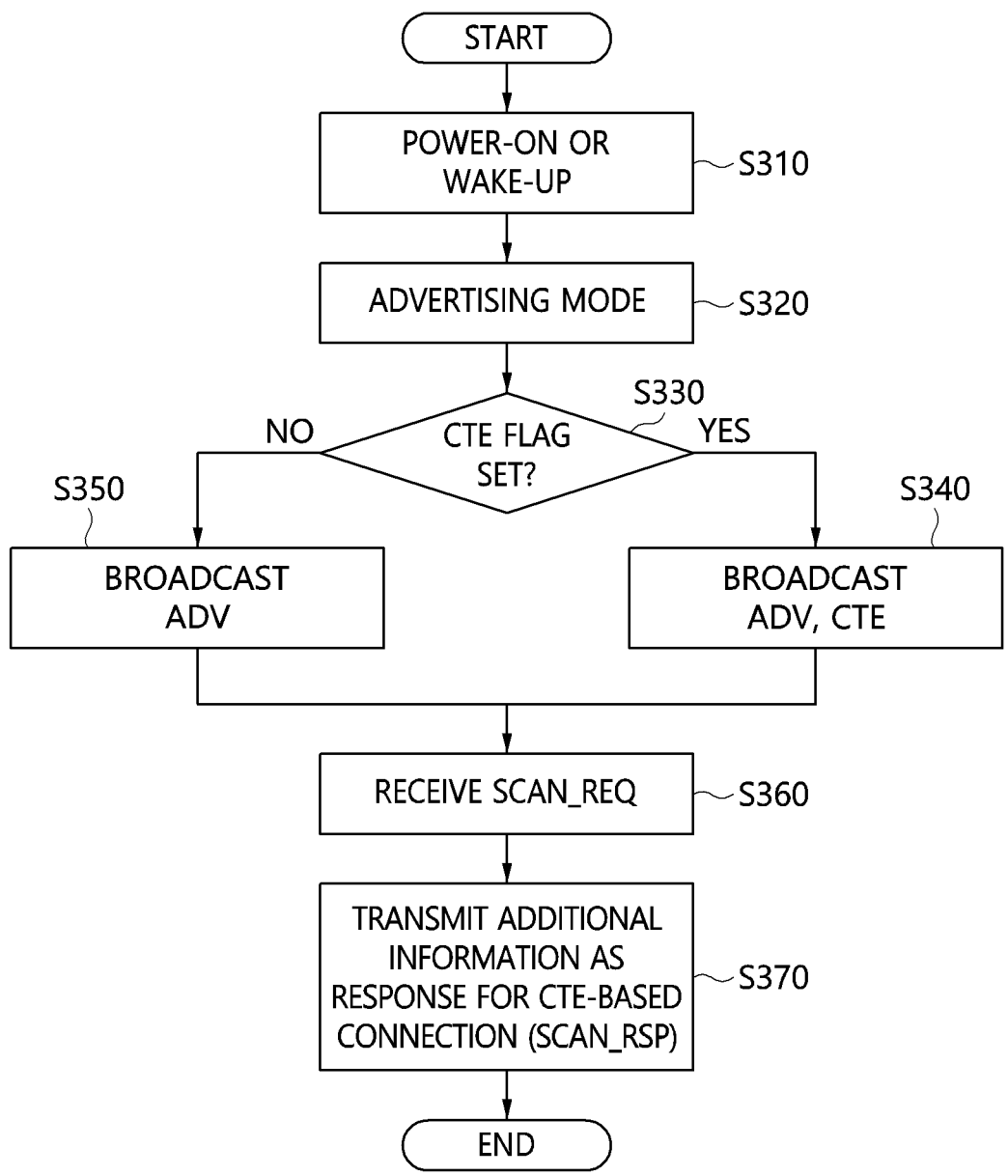
FIG. 3 is an operation flowchart illustrating a Bluetooth connection method based on estimation of a relative angle performed by a communication target device according to an embodiment of the present invention.

FIG. 3 is an operation flowchart illustrating a Bluetooth connection method based on estimation of a relative angle performed by a communication target device according to an embodiment of the present invention.

Referring to FIG. 3, the Bluetooth connection method based on estimation of a relative angle performed by the communication target device 200 according to the embodiment of the present invention initially performs booting, and may be operated in a power-on or wake-up state at step S310.

Next, the Bluetooth connection method based on estimation of a relative angle performed by the communication target device 200 according to the embodiment of the present invention may be operated in an advertising mode at step S320.

Further, the Bluetooth connection method based on estimation of a relative angle performed by the communication target device 200 according to the embodiment of the present invention may determine whether a CTE flag (CTE FLAG) is to be set at step S330.

That is, at step S330, when it is determined that the CTE flag is to be set, relative angle estimation information CTE may be added to an advertising packet, and the advertising packet may be broadcasted at step S340, whereas, when it is determined that a CTE flag is not to be set, only the advertising packet may be broadcasted at step S350.

Here, at step S330, the transmission of CTE may be automatically started by setting the CTE flag.

At step S340, the relative angle estimation information CTE may be included in an exclusive extended packet for CTE transmission (e.g., Extended Advertising Indication (ADV_EXT_IND) packet) defined in a Bluetooth Core Specification 5.1, and then the ADV_EXT_IND packet may be transmitted.

Here, at step S340, the payload of the advertising packet ADV_IND may be filled with partial CRC code and the relative angle estimation information CTE, and then the advertising packet ADV_IND may be transmitted without performing data whitening, depending on whether the CTE flag is to be set. Here, at step S350, the advertising packet ADV_IND in which relative angle estimation information CTE is not included may be transmitted depending on whether the CTE flag is to be set.

That is, depending on whether the CTE flag of the communication target device 200 is to be set, the advertising packet not having relative angle estimation information CTE and the advertising packet having the relative angle estimation information CTE may be periodically transmitted at a preset period at steps S340 and S350.

In addition, at step S340, in the case of old-version Bluetooth standards, partial CRC code and relative angle estimation information CTE may be included in the payload of an advertising packet, and then the advertising packet may be transmitted.

Next, the Bluetooth connection method based on estimation of a relative angle performed by the communication target device 200 according to the embodiment of the present invention may perform steps S360 and S370 as optional functions when the communication target device 200 supports active scanning.

That is, at step S360, a scan request SCAN_REQ may be received from the communication subject device 100, and at step S370, additional information may be transmitted as a response to the communication subject device 100 through a scan response SCAN_RSP.

For example, the additional information may include CTE and CTE-related communication parameters (e.g., CTE information, a CTE transmission period, the number of CTE transmissions, optimal transmission power etc.) that can be used to help calculate relative angle more accurately.

The information about the communication target device may include unique information helping identify indicating the corresponding communication target device, such as the device type (e.g., an audio device, a notebook, a desktop, a smartphone, etc.), specification, characteristics, and user information of the communication target device.

Figure 4:
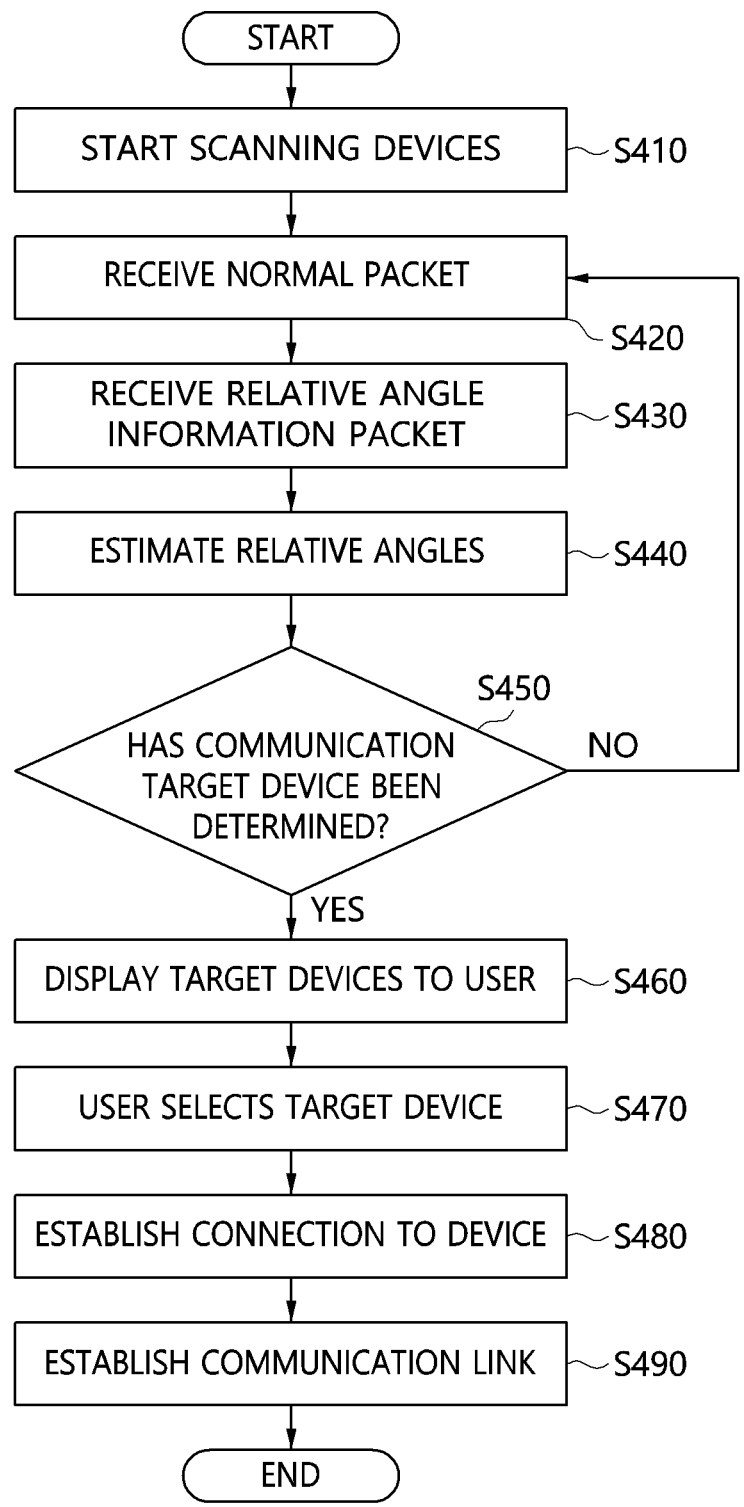
FIG. 4 is an operation flowchart illustrating a Bluetooth connection method based on estimation of a relative angle performed by a communication subject device according to an embodiment of the present invention.

FIG. 4 is an operation flowchart illustrating a Bluetooth connection method based on estimation of a relative angle performed by a communication subject device according to an embodiment of the present invention.

Referring to FIG. 4, the Bluetooth connection method based on estimation of a relative angle performed by the communication subject device 100 according to the embodiment of the present invention may scan communication target devices 200 at step S410.

Further, the Bluetooth connection method based on estimation of a relative angle performed by the communication subject device 100 according to the embodiment of the present invention may receive packets from the scanned communication target devices 200 at step S420.

That is, at step S420, when passive scanning is performed, a normal advertising packet ADV_IND may be received.

Here, at step S420, the normal advertising packet may be received from each communication target device 200 that is set to an advertising mode, which is the operation mode in the state in which a Bluetooth connection is not established.

Next, the Bluetooth connection method based on estimation of a relative angle performed by the communication subject device 100 according to the embodiment of the present invention may receive packets including relative angle information at step S430.

At step S430, the relative angle estimation information included in the payload of the normal advertising packet ADV_IND may be received, or alternatively, the relative angle estimation information may be received through an extended packet ADV_EXT_IND defined in the direction-finding standard.

Here, at step S430, as described above with reference to FIG. 3, the communication target device 200 may broadcast the packet including the relative angle estimation information either at a regular period or at a random period.

Here, at step S430, an advertising packet or an extended packet including relative angle estimation information may be received from the communication target device 200 that is set to the advertising mode, which is the operation mode in which a Bluetooth connection is not established.

Next, the Bluetooth connection method based on estimation of a relative angle performed by the communication subject device 100 according to the embodiment of the present invention may estimate a relative angle at step S440.

That is, at step S440, the relative angles may be estimated using the relative angle estimation information included in the packets received from one or more communication target devices which are scanned for a Bluetooth connection.

Here, at step S440, when an error is not found as a result of performing a check on partial CRC code (i.e., a partial CRC check) included in the payload of each packet in which a de-whitening procedure is skipped, and relative angle estimation information is included in the payload, the relative angle to the communication target device 200 may be estimated using the relative angle estimation information.

Here, at step S440, incidence angles at which radio waves corresponding to the packets are incident on antennas may be calculated using the relative angle estimation information included in the packets, and the relative angles to the communication target device 200 that transmitted the packets may be estimated using the angles between the incidence angles and the angle defined by a preset forward direction.

Here, at step S440, when an error is not found as a result of performing the partial CRC check on the payload of each packet in which a de-whitening procedure is skipped, it may be determined that the relative angle estimation information is included in the payload.

Here, at step S440, when an error is found as a result of performing the partial CRC check on the payload of the packet, a de-whitening procedure and the entire CRC check procedure may be performed.

Here, at step S440, when no error is found as a result of performing the entire CRC check procedure, it may be again determined that the corresponding packet is not a packet including relative angle estimation information, and the corresponding packet may be processed to be a normal advertising packet or an extended packet.

Further, at step S440, the relative angle to the communication target device 200 may be estimated using phase difference information required for relative angle estimation received by the multiple antennas (or the array antenna) of the communication subject device 100.

Here, at step S440, the relative angle may be calculated by a module implemented using hardware (HW) or software (SW) in the link layer or the host layer of the communication subject device 100.

Next, the Bluetooth connection method based on estimation of a relative angle performed by the communication subject device 100 according to the embodiment of the present invention may determine the communication target device at step S450.

That is, at step S450, the communication target device 200 with which a communication link is to be established may be determined based on the estimated relative angle.

At step S450, whether the communication target device 200 is located in the forward direction of the communication subject device 100 may be determined.

Here, at step S450, a communication target device 200, the relative angle of which is less than a preset first relative angle, among multiple communication target devices 200, the relative angles of which have been estimated, may be determined to be the communication target device 200 with which the communication link is to be established.

For example, at step S450, when the estimated relative angle falls within the range of the preset first relative angle (i.e., range of 0°±allowable error), it may be determined that the communication target device 200 is located in the forward direction of the communication subject device 100.

In this case, at step S450, when active scanning is performed as an additional optional function, additional information (e.g., CTE information, a CTE transmission period, an optimal transmission power parameter for CTE calculation, and information about the communication target device) may be additionally received through a scan request SCAN_REQ and a scan response SCAN_RSP, thus improving the precision of the result of estimation of the relative angle.

The information about the communication target device may include unique information helping identify indicating the corresponding communication target device, such as the device type (e.g., an audio device, a notebook, a desktop, a smartphone, etc.), specification, characteristics, and user information of the communication target device.

Here, at step S450, a communication target device 200, the received signal strength indicator (RSSI) value of which is equal to or greater than a preset value, among communication target devices 200, the relative angles of which are less than the preset first relative angle, may be determined to be the communication target device 200 with which the communication link is to be established.

That is, at step S450, when it is determined that the communication target device 200 is not located in the forward direction of the communication subject device 100, information about the corresponding communication target device 200 may be ignored, and the process may return to the packet reception step S420.

At step S450, when the number of communication target devices 200, the estimated relative angles of which are determined to fall within the range of the preset first relative angle, is plural, it may be determined that multiple communication target devices 200 are located in the forward direction.

Next, the Bluetooth connection method based on estimation of a relative angle performed by the communication subject device 100 according to the embodiment of the present invention may display the communication target devices 200 with which communication links can be established at step S460.

That is, at step S460, when it is determined that any communication target devices 200 are located in the forward direction, information about one or more communication target devices 200 (device name, device type, Bluetooth address, normal advertising information, etc.) may be displayed on the display of the communication subject device 100.

In this case, at step S460, when it is determined that the multiple communication target devices 200 are located in the forward direction, only a predefined number of communication target devices 200 in an application may be displayed.

At step S460, the multiple communication target devices 200 may be sorted and arranged in ascending order of the relative angles thereof, and may then be displayed to the user.

Next, the Bluetooth connection method based on estimation of a relative angle performed by the communication subject device 100 according to the embodiment of the present invention may allow the user to select a communication target device with which a communication link is to be established at step S470.

That is, at step S470, when it is determined that multiple communication target devices 200 are located in the forward direction, the communication target device 200 having the smallest relative angle may be automatically selected, and then the user may be asked whether it is desired to connect to the automatically selected communication target device 200. Alternatively, any one of the multiple communication target devices 200 may be selected by the user.

At step S470, the communication target device 200 may be selected using various methods, such as a method of touching a screen when the communication subject device 100 is a smartphone or a method of changing a gaze operation when the communication subject device 100 is a glasses-type terminal device.

For example, at step S470, when the communication subject device 100 is a glasses-type terminal device, the communication target device 200 may be selected based on an input method not using the user's hands, such as the user performing an operation of gazing at a screen for a predetermined period of time (e.g., several seconds) and nodding the user's head, an operation of touching the frame of glasses, eye blinking, or facial motion.

Next, the Bluetooth connection method based on estimation of a relative angle performed by the communication subject device 100 according to the embodiment of the present invention may establish a Bluetooth connection and a communication link at steps S480 and S490.

That is, at step S480, a Bluetooth connection to the selected communication target device 200 may be established.

Here, at step S480, the communication subject device 100 may request additional information from the communication target device 200, and may receive the additional information from the communication target device 200.

For example, the additional information required for the determination of a communication target may include CTE and CTE-related communication parameters (e.g., CTE information, a CTE transmission period, the number of CTE transmissions, optimal transmission power etc.) that can be used to help calculate relative angle more accurately.

The information about the communication target device may include unique information helping identify indicating the corresponding communication target device, such as the device type (e.g., an audio device, a notebook, a desktop, a smartphone, etc.), specification, characteristics, and user information of the communication target device.

Here, at step S480, at least one of a second relative angle and a reestablishment time limit for reestablishing the communication link may be set so as to meet the characteristics of the communication target device 200 with which the communication link has been established by utilizing the additional information received from the communication target device 200.

For example, at step S480, when the communication target device 200 is an audio device, the second relative angle may be set to 10° by receiving the additional information, whereas when the communication target device 200 is a desktop PC, the second relative angle may be set to 15°.

Also, at step S480, the reestablishment time limit during which the relative angle deviates from the second relative angle may be set to different values based on the additional information.

For example, when the communication target device 200 is an audio device, the time during which the relative angle deviates from the second relative angle of 10° may be set to 5 seconds, whereas when the communication target device 200 is a desktop PC, the time during which the relative angle deviates from the second relative angle of 15° may be set to 10 seconds.

That is, at step S480, in consideration of various types of information and characteristics as well as the type of communication target device 200, the second relative angle and the reestablishment time limit during which the relative angle deviates from the second relative angle may also be set by receiving the additional information.

Also, at step S490, a communication link to the communication target device 200 with which a Bluetooth connection has been established may be established (connected).

In this case, at step S490, the communication subject device 100 may check the available services provided by the communication target device 200, and may be provided with one of the services from the communication target device 200.

Further, at step S490, the communication link may be reestablished.

In detail, at step S490, when the relative angle to the communication target device with which the communication link has been established is changed to the preset second relative angle or more, the communication link may be reestablished with any one of communication target devices, relative angles of which are less than the preset first relative angle.

For example, at step S490, in the state in which a communication link between the communication subject device 100 and the communication target device 200-*b* is established, when a forward direction is changed such that the communication subject device 100 faces the communication target device 200-*a*, the relative angle to the communication target device 200-*a* becomes the smallest relative angle, and thus the communication subject device 100 may reestablish the communication link to the communication target device 200-*a*.

For example, at step S490, as in the case of the setting of the second relative angle in the foregoing description, when the communication target device 200 with which the communication link has been established is an audio device, the second relative angle is set to 10°. Therefore, when the communication subject device 100 deviates from the communication target device 200 by a relative angle of 10° or more, the communication link may be reestablished with another communication target device. Further, when the communication target device 200 is a desktop PC, the second relative angle is set to 15°. Therefore, when the communication subject device 100 deviates from the communication target device 200 by a relative angle of 15° or more, the communication link may be reestablished with another communication target device.

Furthermore, at step S490, when the relative angle to the communication target device with which the communication link has been established is changed to the preset second relative angle or more, and when the state in which the relative angle to any one of multiple communication target devices, the relative angles of which have been estimated, falls within the range of a preset first relative angle thereof, is maintained for the reestablishment time limit or longer, the communication link may be reestablished.

For example, at step S490, in the case where the time during which the relative angle deviates from the second relative angle is set, when the communication target device 200 is an audio device, the communication link may be released only when the relative angle deviates from 10° and the time during which the relative angle to the additional communication target device falls within the range of the first relative angle thereof has exceeded 5 seconds. In the case where the communication target device 200 is a desktop PC, the communication link may be released only when the relative angle deviates from 15° and the time during which the relative angle of the additional communication target device falls within the range of the first relative angle exceeds 10 seconds.

By means of this procedure, at step S490, the communication link may be reestablished depending on the user pattern, device priority, and the characteristics of the communication target device 200.

Figure 5:
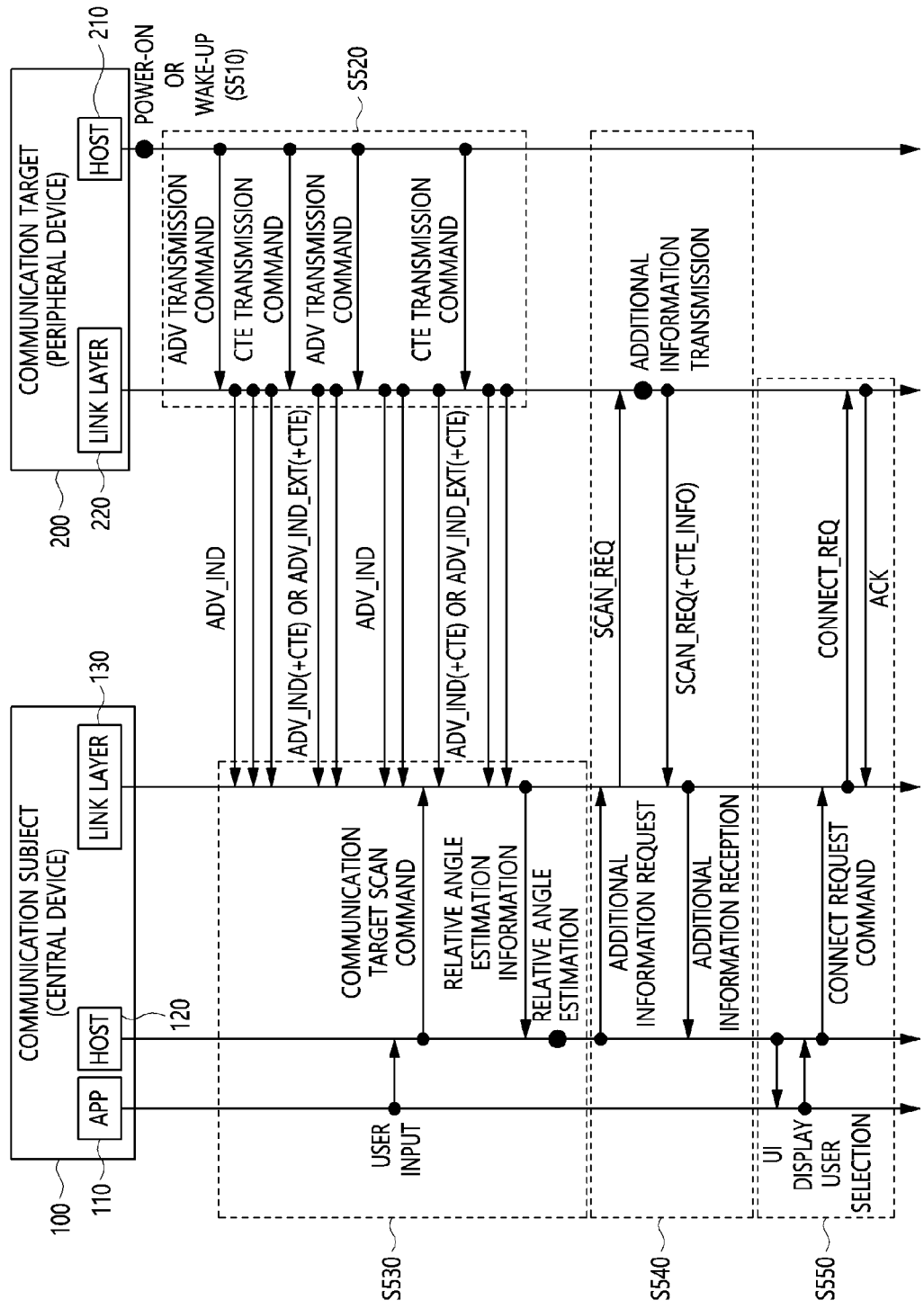
FIG. 5 is a sequence diagram illustrating a Bluetooth connection method based on estimation of a relative angle according to an embodiment of the present invention.

FIG. 5 is a sequence diagram illustrating a Bluetooth connection method based on estimation of a relative angle according to an embodiment of the present invention.

Referring to FIG. 5, when the communication target device 200 is booted, a host layer 210 may perform a power-on or wake-up operation through a Host Control Interface (HCI) at step S510.

Here, in the communication target device 200, the host layer 210 may periodically issue an advertising (ADV) transmission command and a CTE transmission command to a link layer 220 at step S520.

Here, the communication target device 200 may adjust the transmission ratio and the transmission period of normal advertising packets and packets including relative angle estimation information in consideration of a device type, a service to be provided, power consumption, etc.

In the communication subject device 100, an application (APP) layer 110 may receive user input for initiation of Bluetooth connection based on estimation of a relative angle through a Host Control Interface (HCI), may transfer the user input to a host layer 120, may scan communication target devices 200, and may estimate relative angles to the communication target devices 200 at step S530.

At step S530, first, the host layer 120 may issue a scan command to a link layer 130 so as to scan communication target devices 200, and may receive packets from scanned communication target devices 200.

Here, at step S530, when passive scanning is performed, a normal advertising packet ADV_IND may be received.

Here, at step S530, the normal advertising packet may be received from the communication target device 200 that is set to an advertising mode, which is the operation mode in the state in which Bluetooth connection is not established.

That is, at step S530, packets including relative angle information may be received.

Here, at step S530, relative angle estimation information may be received by performing a partial CRC check on the payload of each normal advertising packet ADV_IND and checking whether relative angle estimation information is included in the packet ADV_IND, or may be received through an extended packet ADV_EXT_IND defined in the direction-finding standard.

Here, at step S530, as described above with reference to FIG. 3, the communication target device 200 may broadcast a packet including the relative angle estimation information either at a regular period or at a random period.

Here, at step S530, the advertising packet or extended packet including relative angle estimation information may be received from the communication target device 200 that is set to the advertising mode, which is the operation mode in the state in which a Bluetooth connection is not established.

At step S530, the link layer 130 may receive the relative angle estimation information and transfer the same to the host layer 120.

In this case, at step S530, the host layer 120 may estimate relative angles using the relative angle estimation information included in the packets received from the one or more communication target devices which are scanned for a Bluetooth connection.

At step S530, incidence angles at which radio waves corresponding to the packets are incident on antennas may be calculated using the relative angle estimation information included in the packets, and the relative angles to the communication target device 200 that transmitted the packets may be estimated using the angles between the incidence angles and the angle defined by a preset forward direction.

Here, at step S530, when an error is not found as a result of performing a check on partial CRC code (i.e., a partial CRC check) included in the payload of each packet in which a de-whitening procedure is skipped, and relative angle estimation information is included in the payload, the relative angle to the communication target device 200 may be estimated using the relative angle estimation information.

At step S530, the relative angle to the communication target device 200 may be estimated using phase difference information required for relative angle estimation received by the multiple antennas (or the array antenna) of the communication subject device 100.

Here, at step S530, the relative angle may be calculated by a module implemented using hardware (HW) or software (SW) in the link layer or the host layer of the communication subject device 100.

Further, in the communication subject device 100, the host layer 120 may issue an additional information request command to the link layer 130, and the link layer 130 may receive the additional information from the link layer 220 of the communication target device 200 and transfer the same to the host layer 120 at step S540.

In this case, at step S540, when active scanning is performed as an additional optional function, additional information (e.g., CTE, CTE-related information such as a CTE transmission period, an optimal transmission power, and information about the communication target device) may be additionally received through a scan request SCAN_REQ and a scan response SCAN_RSP, thus improving the precision of the result of estimation of the relative angle.

The information about the communication target device may include unique information helping identify indicating the corresponding communication target device, such as the device type (e.g., an audio device, a notebook, a desktop, a smartphone, etc.), specification, characteristics, and user information of the communication target device.

At step S540, the communication target device 200 with which a communication link is to be established may be determined based on the estimated relative angle.

At step S540, whether the communication target device 200 is located in the forward direction of the communication subject device 100 may be determined.

That is, at step S540, a communication target device 200, the relative angle of which is less than a preset first relative angle, among multiple communication target devices 200, the relative angles of which have been estimated, may be determined to be the communication target device 200 with which the communication link is to be established.

For example, at step S540, when the estimated relative angle falls within the range of the preset first relative angle (i.e., range of 0°±allowable error), it may be determined that the communication target device 200 is located in the forward direction of the communication subject device 100.

Here, at step S540, a communication target device 200, the received signal strength indicator (RSSI) value of which is equal to or greater than a preset value, among communication target devices 200, the relative angles of which are less than the preset first relative angle, may be determined to be the communication target device 200 with which the communication link is to be established.

Here, at step S540, when the number of communication target devices 200, the estimated relative angles of which are determined to fall within the range of the preset first relative angle, is plural, it may be determined that multiple communication target devices 200 are located in the forward direction.

Further, when it is determined that any communication target device 200 is located in the forward direction of the communication subject device 100, information about one or more communication target devices 200 (e.g., device name, device type, Bluetooth address information, normal advertising information, etc.) may be displayed on the display of the communication subject device 100 through the APP layer 110 at step S550.

Here, at step S550, when it is determined that the multiple communication target devices 200 are located in the forward direction, only a predefined number of communication target devices 200 in an application may be displayed.

At step S550, the multiple communication target devices 200 may be sorted and arranged in ascending order of the relative angles thereof, and may then be displayed to the user.

Here, at step S550, the APP layer 110 may allow the user to select the communication target device 200 with which the communication link is to be established, and may transfer information about the selected communication target device 200 to the host layer 120.

Further, at step S550, when it is determined that multiple communication target devices 200 are located in the forward direction, the communication target device 200 having the smallest relative angle may be automatically selected, and then the user may be asked whether it is desired to connect to the automatically selected communication target device 200. Alternatively, any one of the multiple communication target devices 200 may be selected by the user.

At step S550, the communication target device 200 may be selected using various methods, such as a method of touching a screen when the communication subject device 100 is a smartphone or a method of changing a gaze operation when the communication subject device 100 is a glasses-type terminal device.

For example, at step S550, when the communication subject device 100 is a glasses-type terminal device, the communication target device 200 may be selected based on an input method not using the user's hands, such as the user performing an operation of gazing at a screen for a predetermined period of time (e.g., several seconds) and nodding the user's head, an operation of touching the frame of glasses, eye blinking, or facial motion.

Here, at step S550, Bluetooth connection may be made, and the communication link may be established.

Here, at step S550, a Bluetooth connection to the selected communication target device 200 may be established.

At step S550, a communication link may be established with the communication target device 200 with which the Bluetooth connection has been established.

Here, at step S550, the communication subject device 100 may check the available services provided by the communication target device 200, and may be provided with one of the services from the communication target device 200.

Further, at step S550, at least one of a second relative angle and a reestablishment time limit for reestablishing the communication link may be set so as to meet the characteristics of the communication target device 200 with which the communication link has been established by utilizing the additional information received from the communication target device 200.

For example, through the reception of the additional information, when the communication target device 200 is an audio device, the second relative angle may be set to 10° at step S550, whereas when the communication target device 200 is a desktop PC, the second relative angle may be set to 15°.

In this case, through the reception of the additional information, in consideration of various types of information and characteristics as well as the types of communication target devices 200, the second relative angle may also be set.

Also, at step S550, the reestablishment time limit during which the relative angle deviates from the second relative angle may be set to different values based on the additional information.

For example, when the communication target device 200 is an audio device, the time during which the relative angle deviates from the second relative angle of 10° may be set to 5 seconds, whereas when the communication target device 200 is a desktop PC, the time during which the relative angle deviates from the second relative angle of 15° may be set to 10 seconds.

That is, at step S550, in consideration of various types of information and characteristics as well as the type of communication target device 200, the second relative angle and the reestablishment time limit during which the relative angle deviates from the second relative angle may also be set by receiving the additional information.

Further, at step S550, when the relative angle to the communication target device with which the communication link has been established is changed to the preset second relative angle or more, the communication link may be reestablished with any one of communication target devices, relative angles of which are less than the preset first relative angle.

For example, at step S550, in the state in which a communication link between the communication subject device 100 and the communication target device 200-*b* is established, when a forward direction is changed such that the communication subject device 100 faces the communication target device 200-*a*, the relative angle to the communication target device 200-*a* becomes the smallest relative angle, and thus the communication subject device 100 may reestablish the communication link to the communication target device 200-*a*.

For example, at step S550, as in the case of the setting of the second relative angle in the foregoing description, when the communication target device 200 with which the communication link has been established is an audio device, the second relative angle is set to 10°. Therefore, when the communication subject device 100 deviates from the communication target device 200 by a relative angle of 10° or more, the communication link may be reestablished with another communication target device. Further, when the communication target device 200 is a desktop PC, the second relative angle is set to 15°. Therefore, when the communication subject device 100 deviates from the communication target device 200 by a relative angle of 15° or more, the communication link may be reestablished with another communication target device.

Furthermore, at step S550, when the relative angle to the communication target device with which the communication link has been established is changed to the preset second relative angle or more, and when the state in which the relative angle to any one of multiple communication target devices, the relative angles of which have been estimated, falls within the range of a preset first relative angle thereof, is maintained for the reestablishment time limit or longer, the communication link may be reestablished.

For example, at step S550, in the case where the time during which the relative angle deviates from the second relative angle is set, when the communication target device 200 is an audio device, the communication link may be released only when the relative angle deviates from 10° and the time during which the relative angle to the additional communication target device falls within the range of the first relative angle thereof has exceeded 5 seconds. In the case where the communication target device 200 is a desktop PC, the communication link may be released only when the relative angle deviates from 15° and the time during which the relative angle of the additional communication target device falls within the range of the first relative angle exceeds 10 seconds.

By means of this procedure, at step S550, the communication link may be reestablished depending on the user pattern, device priority, and the characteristics of the communication target device 200.

Figure 6:
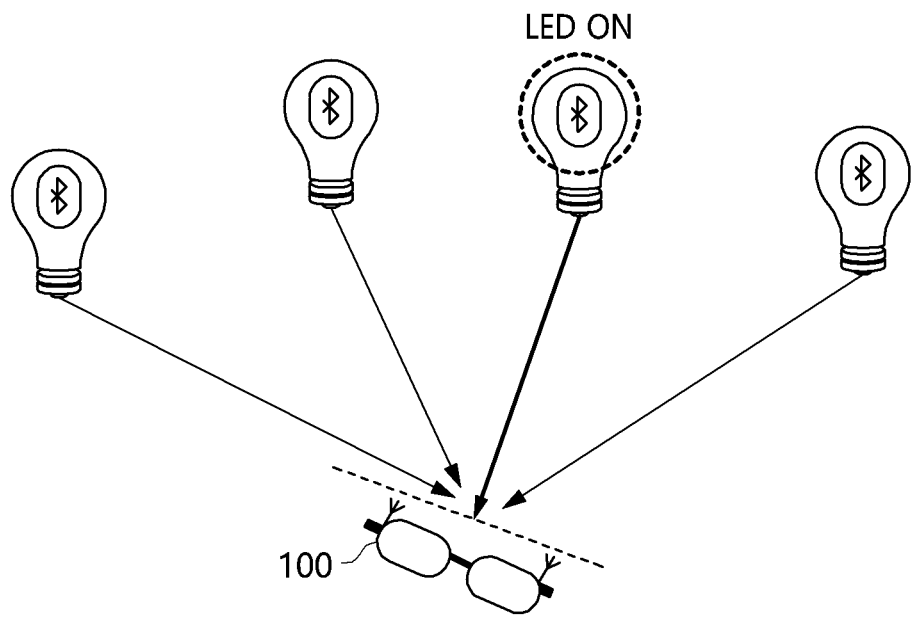
FIG. 6 is a diagram illustrating a Bluetooth connection based on estimation of a relative angle between a glasses-type terminal device and lamp-type terminal devices according to an embodiment of the present invention.

FIG. 6 is a diagram illustrating a Bluetooth connection based on the estimation of a relative angle between a glasses-type terminal device and lamp-type terminal devices according to an embodiment of the present invention.

Referring to FIG. 6, it can be seen that a glasses-type terminal device (communication subject device) 100 may connect to the lamp-type terminal device, for providing a light-emitting diode (LED) lighting service, located in a forward direction through an interface based on user's gaze using a Bluetooth connection based on estimation of a relative angle, and may perform ON/OFF control on the connected lamp-type terminal device.

Figure 7:
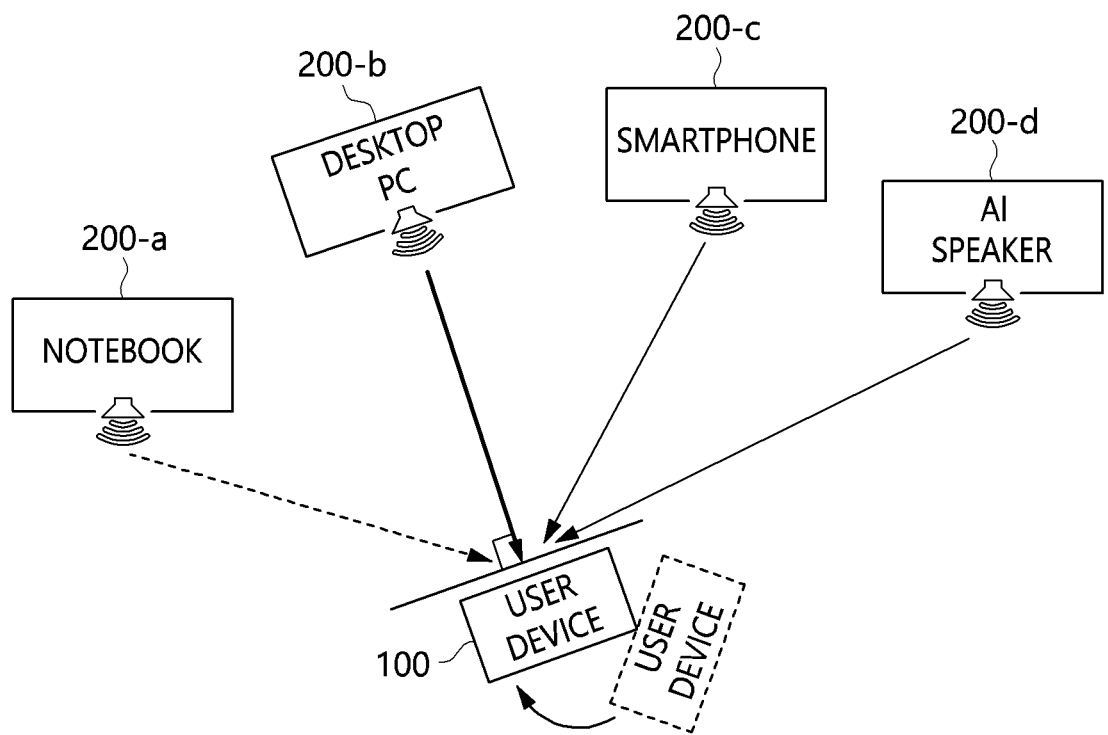
FIG. 7 is a diagram illustrating a Bluetooth connection based on estimation of a relative angle for audio streaming between a user terminal device and communication target devices according to an embodiment of the present invention.

FIG. 7 is a diagram illustrating Bluetooth connection based on estimation of a relative angle for audio streaming between a user terminal device and communication target devices according to an embodiment of the present invention.

Referring to FIG. 7, it can be seen that, in the state in which the user terminal device (communication subject device) 100 according to an embodiment of the present invention receives relative angle estimation information from neighboring devices for the purpose of audio streaming, while a communication link to a notebook 200-a is established and the user hears audio through the notebook 200-a, when the user changes the direction of a target from the notebook 200-a to a desktop 200-b so as to hear desktop audio, the relative angle between these devices may be changed, and thus the communication link may be reestablished with the desktop 200-b.

Figure 8:
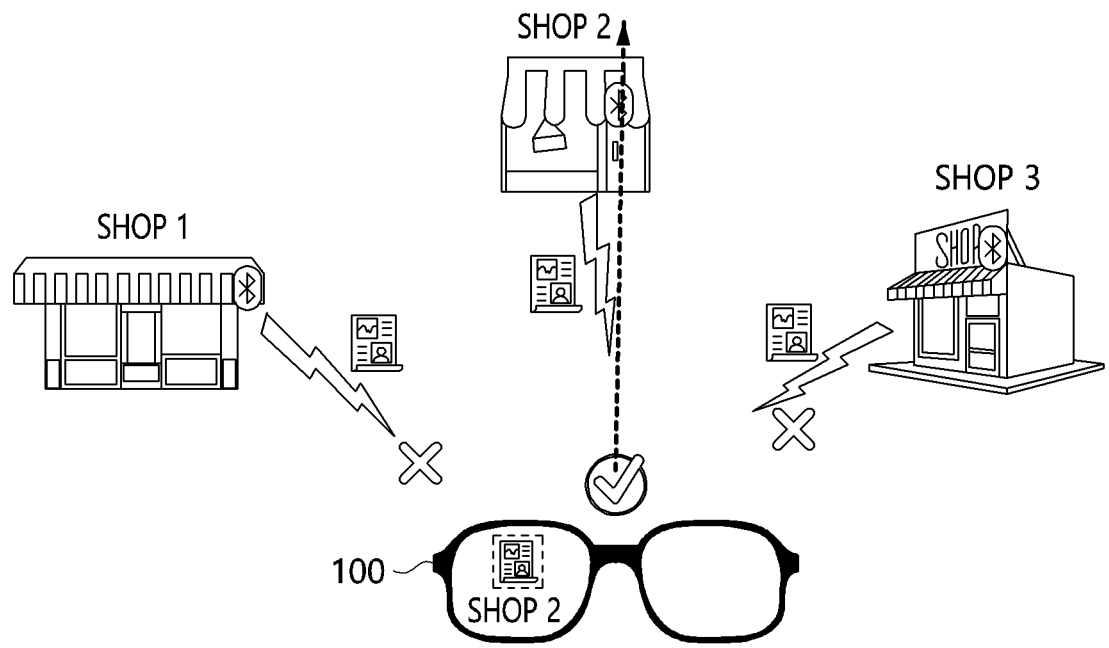
FIG. 8 is a diagram illustrating a Bluetooth connection based on estimation of a relative angle between a glasses-type terminal device and communication target devices in shops according to an embodiment of the present invention.

FIG. 8 is a diagram illustrating a Bluetooth connection based on estimation of a relative angle between a glasses-type terminal device and communication target devices in shops according to an embodiment of the present invention.

Referring to FIG. 8, it can be seen that, when a user who wears the glasses-type terminal device (communication subject device) 100 gazes at a specific shop (or a specific commodity) for a predetermined period of time, only an advertisement transmitted from shop 2, at which the user is gazing, among BLE-based advertisements transmitted from shops (or commodities), may be displayed on the display of the glasses-type terminal device 100. This is advantageous in that, unlike conventional beacon-based advertisements received like spam, the user may acquire only information about an object of interest being gazed at by the user through a Bluetooth connection based on estimation of a relative angle according to an embodiment of the present invention.

Figure 9:
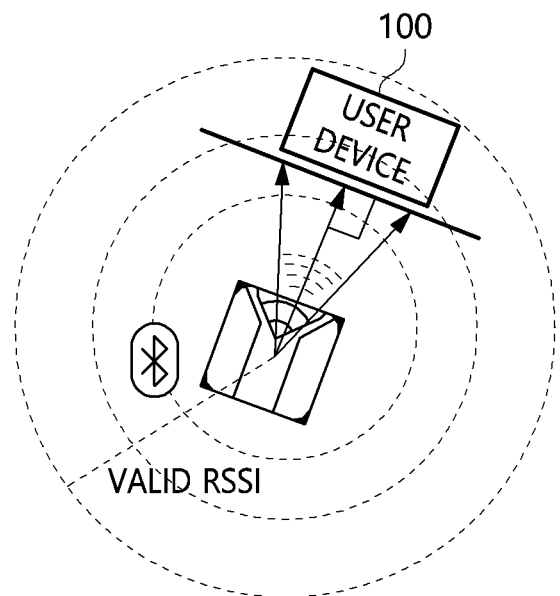
FIG. 9 is a diagram illustrating a Bluetooth connection based on estimation of a relative angle between a user terminal device and a scale device according to an embodiment of the present invention.

FIG. 9 is a diagram illustrating a Bluetooth connection based on estimation of a relative angle between a user terminal device and a scale device according to an embodiment of the present invention.

Referring to FIG. 9, it can be seen that the user terminal device 100 receives personal information, such as a weight, from the scale device through Bluetooth communication.

In this case, the user terminal device (communication subject device) 100 may relatively conveniently and securely receive a small amount of data using a Received Signal Strength Indicator (RSSI) and a relative angle.

Figure 10:
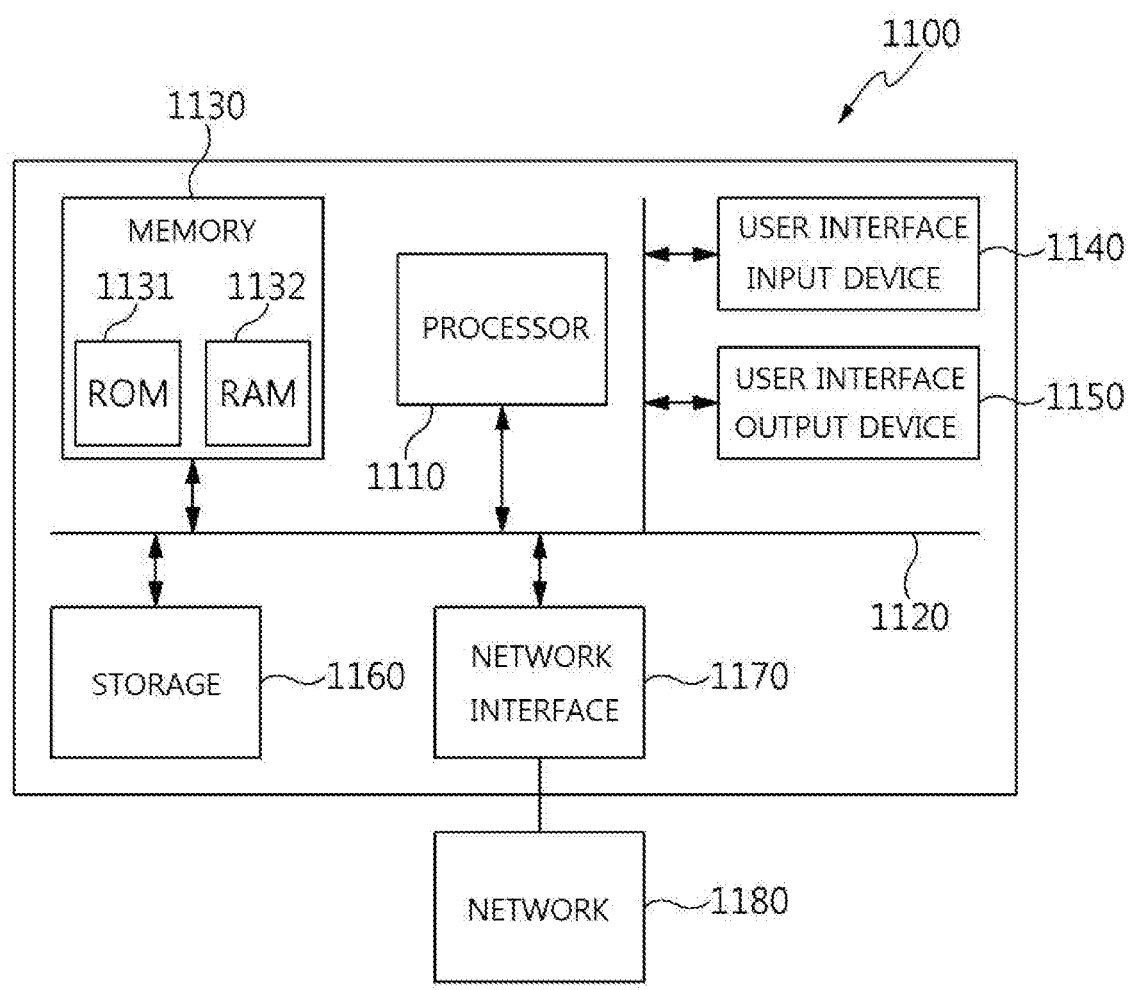
FIG. 10 is a block diagram illustrating a computer system according to an embodiment of the present invention.

FIG. 10 is a diagram illustrating a computer system according to an embodiment of the present invention.

Referring to FIG. 10, a communication subject device 100, which is a Bluetooth connection device based on estimation of a relative angle according to an embodiment of the present invention, and a communication target device 200 may be implemented in a computer system 1100, such as a computer-readable storage medium. As illustrated in FIG. 13, the computer system 1100 may include one or more processors 1110, memory 1130, a user interface input device 1140, a user interface output device 1150, and storage 1160, which communicate with each other through a bus 1120. The computer system 1100 may further include a network interface 1170 connected to a network 1180. Each processor 1110 may be a Central Processing Unit (CPU) or a semiconductor device for executing processing instructions stored in the memory 1130 or the storage 1160. Each of the memory 1130 and the storage 1160 may be any of various types of volatile or nonvolatile storage media. For example, the memory 1130 may include Read-Only Memory (ROM) 1131 or Random Access Memory (RAM) 1132.

That is, the Bluetooth connection device 100 based on estimation of a relative angle according to an embodiment of the present invention may include one or more processors 1110 and execution memory 1130 for storing at least one program that is executed by the one or more processors 1110, wherein the at least one program is configured to estimate relative angles using relative angle estimation information included in packets received from one or more communication target devices 200 that are scanned for a Bluetooth connection, determine a communication target device 200 with which a communication link is to be established based on the estimated relative angles, and establish a communication link through a Bluetooth connection to the determined communication target device 200, and reestablish the communication link to any one of additional communication target devices, relative angles of which have been estimated, depending on a change in a relative angle to the communication target device with which the communication link has been established.

Here, the at least one program may be configured to receive the packets from the one or more communication target devices 200 set to an operation mode in the state in which a Bluetooth connection is not established.

Here, the at least one program is configured to calculate incidence angles at which radio waves corresponding to the packets are incident on antennas using relative angle estimation information included in the packet, and to estimate the relative angle to the communication target device 200 that transmitted the packet using the angle between the incidence angles and the angle defined by a preset forward direction.

Here, wherein the at least one program is configured to, when an error is not found as a result of performing a partial CRC check on a payload of the packet in which a de-whitening procedure is skipped, determine that the relative angle estimation information is included in the payload.

Here, the at least one program is configured to determine at least one communication target device 200, a relative angle of which is less than a preset first relative angle, among multiple communication target devices 200, relative angles of which have been estimated, to be the communication target device with which the communication link is to be established.

Here, the at least one program is configured to determine a communication target device 200, a Received Signal Strength Indictor (RSSI) value of which is equal to or greater than a preset value, among communication target devices 200, the relative angles of which are less than the preset first relative angle, to be the communication target device 200 with which the communication link is to be established.

Here, the at least one program is configured to, when the relative angle to the communication target device 200 with which the communication link has been established is changed to a preset second relative angle or more, reestablish the communication link to any one of the communication target devices 200, relative angles of which are less than the preset first relative angle.

Here, the at least one program may be configured to set a second relative angle and a reestablishment time limit for reestablishing the communication link to meet the characteristics of the communication target device 200 using the additional information received from the communication target device 200 with which the communication link has been established.

Here, the at least one program may be configured to, when the relative angle to the communication target device 200 with which the communication link has been established is changed to the preset second relative angle or more and when a state in which the relative angle falls within a range of a preset first relative angle of any one of multiple communication target devices 200, the relative angles of which have been estimated, is maintained for the time for reestablishing the communication link or longer, reestablish the communication link.

The present invention may provide an intuitive wireless connection while minimizing an interface for a connection operation between devices supporting Bluetooth pairing.

Further, the present invention may enable a new connection to an additional device to be naturally established even if a connection between devices supporting Bluetooth pairing has been released.

Furthermore, the present invention may make it easy to select and identify a device desired by a user from among devices supporting Bluetooth pairing and to provide a connection and transmit information to a device located in a specific direction.

Furthermore, the present invention may improve user experience and product marketability and can provide users with new services through a convenient wireless connection.

As described above, in the Bluetooth connection device and method based on estimation of a relative angle according to the present invention, the configurations and schemes in the above-described embodiments are not limitedly applied, and some or all of the above embodiments can be selectively combined and configured so that various modifications are possible.

What is claimed is:

1. A Bluetooth connection method based on estimation of a relative angle, the Bluetooth connection method being performed by a Bluetooth connection device based on estimation of a relative angle, the Bluetooth connection method comprising:
  estimating relative angles using relative angle estimation information included in packets received from one or more communication target devices that are scanned for a Bluetooth connection;
  determining a communication target device with which a communication link is to be established based on the estimated relative angles; and
  establishing a communication link through a Bluetooth connection to the determined communication target device, and reestablishing the communication link to any one of additional communication target devices, relative angles of which have been estimated, depending on a change in a relative angle to the communication target device with which the communication link has been established,
  wherein the establishing the communication link is configured to request additional information from the determined communication target device through the communication link and reestablish the communication link to meet characteristics of the communication target device with which the communication link has been established using additional information received from the communication target device,
  wherein the additional information includes Constant Tone Extension (CTE) and CTE-related communication parameters and information about device type of the communication target device,
  wherein the communication target device is configured to continuously broadcast a packet including the CTE as if normal advertising packets were broadcast, and
  wherein establishing the communication link is configured to display the additional information about the determined communication target device for a user, and reestablish the communication link depending on input of the user, the additional information and change in the relative angle to the determined communication target device.

2. The Bluetooth connection method of claim 1, wherein estimating the relative angles is configured to receive the packets from the one or more communication target devices set to an operation mode in a state in which a Bluetooth connection is not established.

3. The Bluetooth connection method of claim 2, wherein estimating the relative angles is configured to calculate incidence angles at which radio waves corresponding to the packets are incident on antennas using the relative angle estimation information included in the packets, and to estimate the relative angles to the communication target devices that transmitted the packets using angles between the incidence angles and an angle defined by a preset forward direction.

4. The Bluetooth connection method of claim 3, wherein estimating the relative angles is configured to, when an error is not found as a result of performing a partial Cyclic Redundancy Check (CRC) check on a payload of each packet, determine that the relative angle estimation information is included in the payload.

5. The Bluetooth connection method of claim 2, wherein determining the communication target device is configured to determine at least one communication target device, a relative angle of which is less than a preset first relative angle, among multiple communication target devices, relative angles of which have been estimated, to be the communication target device with which the communication link is to be established.

6. The Bluetooth connection method of claim 5, wherein determining the communication target device is configured to determine a communication target device, a Received Signal Strength Indictor (RSSI) value of which is equal to or greater than a preset value, among communication target devices, the relative angles of which are less than the preset first relative angle, to be the communication target device with which the communication link is to be established.

7. The Bluetooth connection method of claim 6, wherein establishing the communication link is configured to, when the relative angle to the communication target device with which the communication link has been established is changed to a preset second relative angle or more, reestablish the communication link to any one of the communication target devices, relative angles of which are less than the preset first relative angle.

8. The Bluetooth connection method of claim 7, wherein establishing the communication link is configured to set at least one of the second relative angle for reestablishing the communication link and a time for reestablishing the communication link to meet characteristics of the communication target device with which the communication link has been established using additional information received from the communication target device.

9. The Bluetooth connection method of claim 8, wherein establishing the communication link is configured to, when the relative angle to the communication target device with which the communication link has been established is changed to the preset second relative angle or more and when a state in which the relative angle falls within a range of a preset first relative angle of any one of multiple communication target devices, the relative angles of which have been estimated, is maintained for the time for reestablishing the communication link or longer, reestablish the communication link.

10. A Bluetooth connection device, comprising:
one or more processors; and
an execution memory for storing at least one program that is executed by the one or more processors,
wherein the at least one program is configured to:
estimate relative angles using relative angle estimation information included in packets received from one or more communication target devices that are scanned for a Bluetooth connection;
determine a communication target device with which a communication link is to be established based on the estimated relative angles; and
establish a communication link through a Bluetooth connection to the determined communication target device, and reestablish the communication link to any one of additional communication target devices, relative angles of which have been estimated, depending on a change in a relative angle to the communication target device with which the communication link has been established,
wherein the at least one program is configured to request additional information from the determined communication target device through the communication link and reestablish the communication link to meet characteristics of the communication target device with which the communication link has been established using additional information received from the communication target device,
wherein the additional information includes Constant Tone Extension (CTE) and CTE-related communication parameters and information about device type of the communication target,
wherein the communication target device is configured to continuously broadcast a packet including the CTE as if normal advertising packets were broadcast, and
wherein the at least one program is configured to display the additional information about the determined communication target device for a user, and reestablish the communication link depending on input of the user, the additional information and change in the relative angle to the determined communication target device.

11. The Bluetooth connection device of claim 10, wherein the at least one program is configured to receive the packets from the one or more communication target devices set to an operation mode in a state in which a Bluetooth connection is not established.

12. The Bluetooth connection device of claim 11, wherein the at least one program is configured to calculate incidence angles at which radio waves corresponding to the packets are incident on antennas using the relative angle estimation information included in the packets, and to estimate the relative angles to the communication target devices that transmitted the packets using angles between the incidence angles and an angle defined by a preset forward direction.

13. The Bluetooth connection device of claim 12, wherein the at least one program is configured to, when an error is not found as a result of performing a partial Cyclic Redundancy Check (CRC) check on a payload of each packet, determine that the relative angle estimation information is included in the payload.

14. The Bluetooth connection device of claim 12, wherein the at least one program is configured to determine at least one communication target device, a relative angle of which is less than a preset first relative angle, among multiple communication target devices, relative angles of which have been estimated, to be the communication target device with which the communication link is to be established.

15. The Bluetooth connection device of claim 14, wherein the at least one program is configured to determine a communication target device, a Received Signal Strength Indictor (RSSI) value of which is equal to or greater than a preset value, among communication target devices, the relative angles of which are less than the preset first relative angle, to be the communication target device with which the communication link is to be established.

16. The Bluetooth connection device of claim 14, wherein the at least one program is configured to, when the relative angle to the communication target device with which the communication link has been established is changed to a preset second relative angle or more, reestablish the communication link to any one of the communication target devices, relative angles of which are less than the preset first relative angle.

17. The Bluetooth connection device of claim 16, wherein the at least one program is configured to set at least one of the second relative angle for reestablishing the communication link and a time for reestablishing the communication link to meet characteristics of the communication target device with which the communication link has been established using additional information received from the communication target device.

18. The Bluetooth connection device of claim 17, wherein the at least one program is configured to, when the relative angle to the communication target device with which the communication link has been established is changed to the preset second relative angle or more and when a state in which the relative angle falls within a range of a preset first relative angle of any one of multiple communication target devices, the relative angles of which have been estimated, is maintained for the time for reestablishing the communication link or longer, reestablish the communication link.

* * * * *